United States Patent
Masson et al.

(10) Patent No.: US 9,092,584 B2
(45) Date of Patent: Jul. 28, 2015

(54) METHOD AND SYSTEM FOR DESIGNING A MODELED ASSEMBLY OF AT LEAST ONE OBJECT IN A COMPUTER-AIDED DESIGN SYSTEM

(71) Applicant: Dassault Systemes, Velizy Villacoublay (FR)

(72) Inventors: Hubert Masson, Saint Germain en Laye (FR); Pierre-Antoine Arrighi, Paris (FR)

(73) Assignee: Dassault Systemes, Velizy Villacoublay (FR)

( * ) Notice: Subject to any disclaimer, the term of this patent is extended or adjusted under 35 U.S.C. 154(b) by 242 days.

(21) Appl. No.: 13/679,023

(22) Filed: Nov. 16, 2012

(65) Prior Publication Data

US 2014/0005984 A1    Jan. 2, 2014

(30) Foreign Application Priority Data

Nov. 3, 2011    (EP) .................................... 11187761

(51) Int. Cl.
*G06F 3/048*     (2013.01)
*G06T 11/60*     (2006.01)
*G06F 17/50*     (2006.01)
*G06F 3/0481*    (2013.01)

(52) U.S. Cl.
CPC ............ *G06F 17/50* (2013.01); *G06F 3/04817* (2013.01); *G06T 11/60* (2013.01); *G06F 2203/04806* (2013.01)

(58) Field of Classification Search
CPC ...... G06F 17/50; G06F 3/04817; G06T 11/60
See application file for complete search history.

(56) References Cited

U.S. PATENT DOCUMENTS

| | | | | |
|---|---|---|---|---|
| 6,640,185 | B2 * | 10/2003 | Yokota et al. | 701/455 |
| 7,456,883 | B2 * | 11/2008 | Yoo et al. | 348/305 |
| 2005/0086612 | A1 * | 4/2005 | Gettman et al. | 715/848 |
| 2007/0079255 | A1 * | 4/2007 | Gourdol et al. | 715/815 |
| 2007/0211059 | A1 * | 9/2007 | Trippe et al. | 345/440 |
| 2008/0104027 | A1 * | 5/2008 | Imler et al. | 707/3 |
| 2008/0180460 | A1 * | 7/2008 | Ford | 345/661 |
| 2008/0238916 | A1 * | 10/2008 | Ghosh et al. | 345/419 |
| 2008/0284800 | A1 * | 11/2008 | Ross | 345/661 |
| 2008/0288886 | A1 * | 11/2008 | Sherwood et al. | 715/772 |

(Continued)

FOREIGN PATENT DOCUMENTS

EP        2 045 793        4/2009

OTHER PUBLICATIONS

'Cell Size and Scale'. The University of Utah, Genetic Science Learning Center., May 5, 2011 [retrieved on Oct. 29, 2014]. Retrieved from the Internet: <https://web.archive.org/web/20110505093437/http://learn.genetics.utah.edu/content/begin/cells/scale/>.*

(Continued)

*Primary Examiner* — Amy M Levy
(74) *Attorney, Agent, or Firm* — Hamilton, Brook, Smith & Reynolds, P.C.

(57) ABSTRACT

A computer-implemented method of designing a modeled assembly of at least one object in a computer-aided design system, the method comprising the steps of providing a set of icons, each icon being representative of a range of scales of size; determining the dimensions of a view (40) of said modeled assembly; and displaying continuously the icon representative of the range of scales of size corresponding to said dimensions.

10 Claims, 14 Drawing Sheets

(56) References Cited

U.S. PATENT DOCUMENTS

| | | | |
|---|---|---|---|
| 2009/0079732 A1* | 3/2009 | Fitzmaurice et al. | 345/419 |
| 2010/0169823 A1* | 7/2010 | Audet | 715/784 |
| 2010/0192086 A1* | 7/2010 | Kocienda et al. | 715/773 |
| 2011/0007074 A1 | 1/2011 | Sakashita | |
| 2011/0043517 A1* | 2/2011 | Schneider et al. | 345/419 |
| 2011/0063248 A1 | 3/2011 | Yoon | |
| 2011/0265041 A1* | 10/2011 | Ganetakos et al. | 715/834 |
| 2012/0065944 A1* | 3/2012 | Nielsen et al. | 703/1 |
| 2012/0147242 A1* | 6/2012 | Kouda et al. | 348/333.01 |
| 2012/0188280 A1* | 7/2012 | Charlebois et al. | 345/634 |
| 2013/0332859 A1* | 12/2013 | Patton et al. | 715/753 |

OTHER PUBLICATIONS

European Search Report of EP 11187761.9 dated May 4, 2012.
Huang, et al. "The Scale of the Universe", http://htwins.net/scale retrieved from Internet Mar. 12, 2012.

* cited by examiner

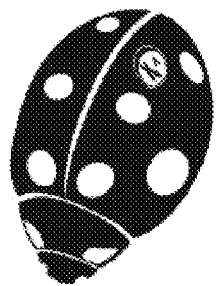
FIG.4
FIG.5
FIG.6
FIG.7
FIG.8
FIG.9
FIG.10
FIG.11

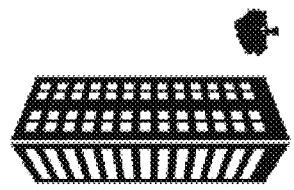
FIG.15
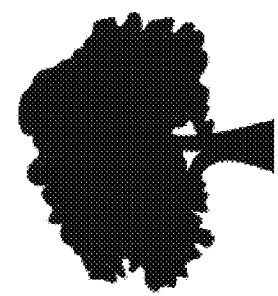
FIG.14
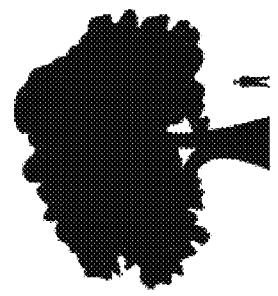
FIG.13
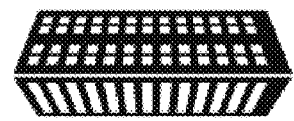
FIG.16
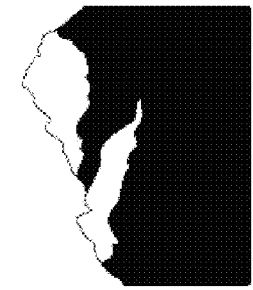
FIG.18
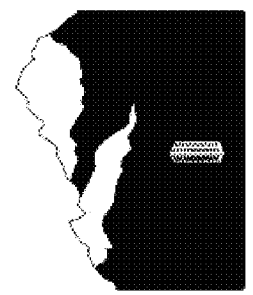
FIG.17
FIG.12

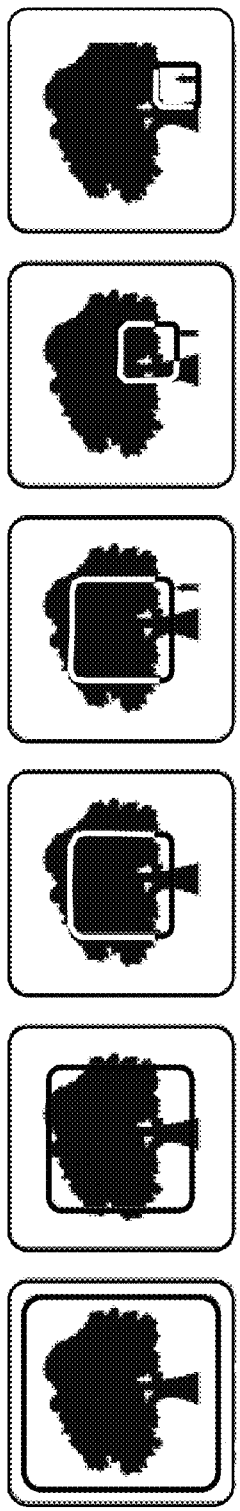
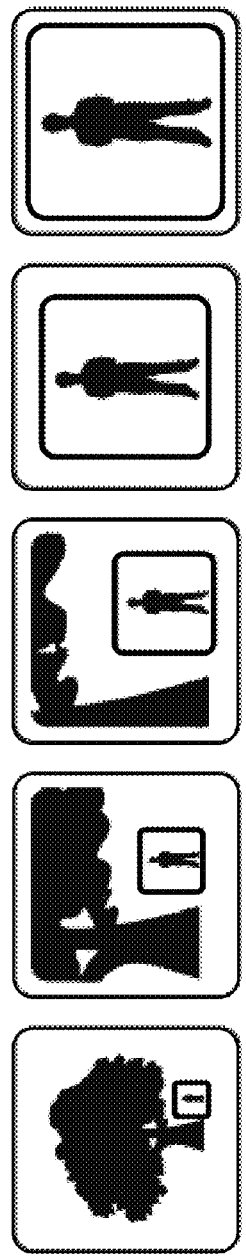

METHOD AND SYSTEM FOR DESIGNING A MODELED ASSEMBLY OF AT LEAST ONE OBJECT IN A COMPUTER-AIDED DESIGN SYSTEM

RELATED APPLICATION

This application claims priority under 35 U.S.C. §119 or 365 and/or otherwise is related to European Application No. 11187761.9, filed Nov. 3, 2011.

The entire teachings of the above application(s) are incorporated herein by reference.

FIELD OF THE INVENTION

The invention relates to the field of computers programs and systems, and more specifically to the field of designing of an assembly of object in a Computer-Aided Design application.

BACKGROUND OF THE INVENTION

Computer-aided techniques are known to include Computer-Aided Design or CAD, which relates to software solutions for authoring product design. Similarly, CAE is an acronym for Computer-Aided Engineering, e.g. it relates to software solutions for simulating the physical behavior of a future product. CAM stands for Computer-Aided Manufacturing and typically includes software solutions for defining manufacturing processes and operations.

A number of systems and programs are offered on the market for the design of objects (or parts) or assemblies of objects, forming a product, such as the one provided by Dassault Systèmes under the trademark CATIA. These CAD systems allow a user to construct and manipulate complex three dimensional or 3D models of objects or assemblies of objects. CAD systems thus provide a representation of modeled objects using edges or lines, in certain cases with faces. Lines or edges may be represented in various manners, e.g. non-uniform rational B-splines (NURBS). These CAD systems manage parts or assemblies of parts as modeled objects, which are mostly specifications of geometry. Specifically, CAD files contain specifications, from which geometry is generated, which in turn allow for a representation to be generated. Geometry and representation may be stored in a single CAD file or multiple ones. CAD systems include graphic tools for representing the modeled objects to the designers; these tools are dedicated to the display of complex objects; the typical size of a file representing an object in a CAD system being in the range of one Megabyte per part, and an assembly may comprise thousands of parts. A CAD system manages models of objects, which are stored in electronic files.

In computer-aided techniques, the graphical user interface GUI plays an important role as regards the efficiency of the technique. Most of the operations required for manipulating and/or navigating the modeled objects may be performed by the user (e.g. the designers) on the GUI. Especially, the user may create, modify, and delete the modeled objects forming the product, and also explore the product so as to comprehend how modeled objects are interrelated, e.g. via a product structure. Traditionally, these operations are carried out through dedicated menus and icons which are located on the sides of the GUI. Recently, CAD systems such as CATIA allow calling these operations nearby the representation of the product. The designer does not need anymore to move the mouse towards menus and icons. Operations are thus available within reach of the mouse. In addition, the operations behave semantically: for a given operation selected by the designer, the CAD system may suggest to the designer, still nearby the mouse, a set of new operations according to the former selected operation that the designer is likely to select.

Until recent years, some computer software used, for example in automotive and aerospace industry, are based on geometry, for mechanical engineers to be able to see their work in space or in a three-dimensional displaying.

SUMMARY OF THE INVENTION

In this domain, computer software like CATIA, SolidWorks, NX, and ProEngineer allow design geometry in a three dimension space. The graphical user interfaces or GUI can be typical CAD-like interfaces with standard menu bars. Such menu and toolbars contain a set of user-selectable icons, each icon being associated with one or more operations or functions. Some of these icons are associated with software tools, adapted for editing and/or working on a 3D geometrical modeled product or parts of product such as that displayed in the graphical user interfaces GUI. In the following description, terms "product", "part", "assembly" and the like may be referred to as "part" for the sake of simplicity. The concept of "part" can also be generalized to that of "object". An object encompasses any constituent of the final digital mock-up, for instance, considering an assembly, an object of this assembly can be a sub-assembly, a part, a kinematic joint, a material, the embedded software executed on an Electronic Control Unit (ECU), or any object needed to describe the entire environment of the assembly, like the modeling of the atmosphere in the case you want to study an airplane flying capacities.

Displaying an element near the assembly is known, as for example the standing man used in CATIA LiveShape, which is called here the 3D silhouette. It is embedded into the 3D scene and gives a scale indication while an object is designed next to it. This concept got several important limitations, as illustrated, for example, respectively on FIGS. 1, 2 and 3 of the screen of a user, wherein:
  at human zoom size, the silhouette 10 fits well but can cause occlusion or disturbance;
  at very large zoom, the silhouette 20 is too big, and useless;
  at very small zoom, the silhouette 30 is too small, and useless.

A goal of the present invention is to overcome these problems.

More particularly, a goal of the invention is to determine continuously and easily a representative size of the current view.

It is proposed, according to one aspect of the invention, a computer-implemented method of designing a modeled assembly of at least one object in a computer-aided design system, the method comprising the steps of:
  providing a set of icons, each icon being representative of a range of scales of size;
  determining the dimensions of a view of said modeled assembly; and
  displaying continuously the icon representative of the range of scales of size corresponding to said dimensions.

Making an automatic continue link between the dimensions of a view of a modeled assembly of at least one object displayed on a screen, and a range of scales of size through an icon representative of the range of scales of size corresponding to the dimensions of the view, allows to the user to work more efficiently, and to know continuously the range of scales of size of the view displayed on his screen, whatever following of zooms (in other words zooms in) or unzooms (in other words zooms out or dezooms) made before.

Furthermore, these icons could be latter used to represent the global size of models when they are presented in thumbnails.

According to an embodiment, the displaying of the icon representative of the range of scales of size corresponding to the dimensions of said view is comprised in an external frame.

Thus, a separation between the displaying of the view of the modeled assembly of at least one object and of the icon representative of the range of scales of size, is clear, and these displaying are changing in a linked manner.

For example, the external frame can be displayed in the bottom of the screen, for example in the right corner.

According to an embodiment, the set of icons comprises:
  a first subset wherein each icon represents a usual element, and
  a second subset wherein each icon represents a transition between two consecutive icons of the first subset.

The understanding of the user is then facilitate, and he can then works more efficiently, and notably more quickly.

For example, an icon of said second subset comprising the superposition of the two elements represented by said two consecutive icons of the first subset.

The understanding of the user is then facilitate, and he can works more efficiently.

Depending of the working size, a computer program according to an aspect of the invention, can provide the most relevant tools for the current view of the user, for raw or sharp action for example. The user could also rearrange the provided tools by associating them to a particular icon, i.e. depending on the size of the view.

According to an embodiment, a dynamic frame is dynamically displayed on the displayed icon, to indicate the size of said view relative to the range of scales of size represented by the displayed icon.

The efficiency of the set of icons is therefore improved by another degree of precision, without the use of any figure.

According to an embodiment, during a transition, a zoom (in other words a zoom in), or an unzoom (in other words a zoom out) is made in the external frame, so as to obtain in the external frame a passage without discontinuity between two successive displayed icons, each from a different subset.

Thus, such a displaying allows a non discontinuity, and can jump to one icon directly to another if the degree of zoom is arbitrary chosen (by indicating its value for example, from 100% to 500%).

According to an embodiment, during a zoom of said view, the corresponding linked displaying of a series of icons alternatively in the first and second subsets and ordered by increasing or decreasing range of scales of size, comprises the iterative steps of:
  the size of the dynamic frame is decreased relatively to an icon of the first subset of said series;
  the following icon of said ordered series, in the decreasing order, replaces continuously the preceding icon, the common element of the two icons is superposed at the moment of change of icon;
  the dynamic frame focus on the other element;
  the size of the dynamic frame and the displayed part of the icon change simultaneously in the inverse proportions; and
  the following icon of said ordered series, in the decreasing order, replaces continuously the preceding icon, during an animation of the icon of the second subset.

Thus, it permits, during a zoom of the view, to have a continuous correlation between the dimensions of the view and the range of scales of size of the corresponding icon.

According to an embodiment, during an unzoom of said view, the corresponding linked displaying of a series of icons alternatively in the first and second subsets and ordered by increasing or decreasing range of scales of size, comprises the iterative steps of:
  the following icon of said ordered series, in the increasing order, replaces continuously the preceding icon, with the adapted proportions, the common element of the two icons is superposed at the moment of change of icon, during an animation of the icon of the second subset;
  the size of the dynamic frame and the displayed part of the icon change simultaneously in the inverse proportions;
  the dynamic frame focus on the other element; and
  the size of the dynamic frame is decreased relatively to the icon.

Thus, it permits, during a dezoom of the view, to have a continuous correlation between the dimensions of the view and the range of scales of size of the corresponding icon.

The invention further proposes a computer program product, stored on a computer readable medium, for designing an assembly of objects in a system of computer-aided design, the computer program comprising code means for implementing the steps of the method as described below.

The invention still concerns an apparatus for designing an assembly of objects in a system of computer-aided design, the apparatus comprising means for implementing the steps of the method as described below.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

The invention will be better understood with the study of some embodiments described by way of non-limiting examples and illustrated by the accompanying drawings wherein:

FIGS. 4 to 18 illustrate an example of a set of icons representative of a range of scales of size, representing usual elements, according to an aspect of the invention;

FIGS. 27 up to 37 illustrate more precisely the chaining of icons during a zoom;

FIGS. 37 up to 27 illustrate more precisely the chaining of icons during an unzoom.

DETAILED DESCRIPTION OF THE INVENTION

Figure 3:
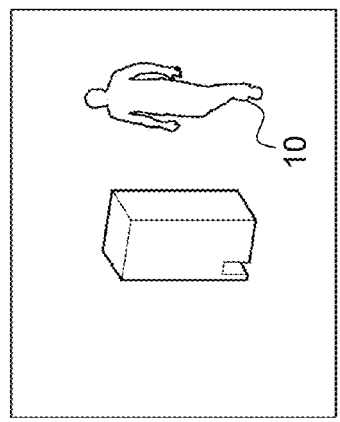
FIGS. 1, 2 and 3 illustrate a known system with displaying an element near the assembly, according to the state of the art.
Figure 2:
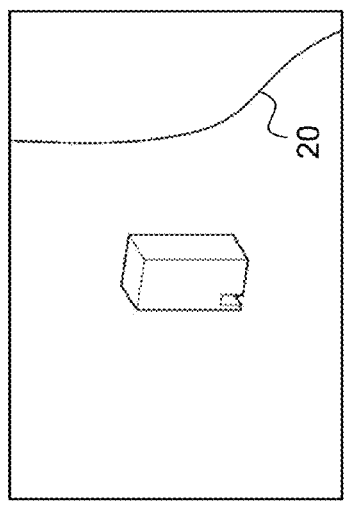
Figure 1:
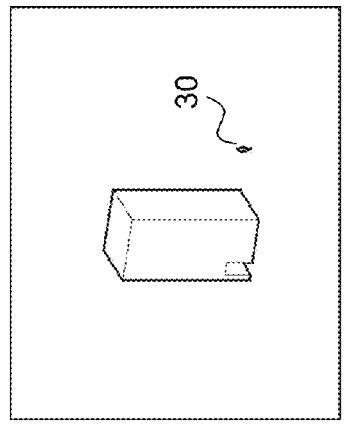

The preferred embodiment of the present invention has been described. It will be understood that various modifications may be made without departing from the spirit and scope of the invention. Therefore, other implementations are within the scope of the following claims. For instance, the ranking of the criteria may depend on the technical context of the assembly.

A set of icons is designed to be considered as the most relevant with a range of scales of size. In a preferred embodiment, the set of icons comprises a first subset wherein each icon represents a usual element, and a second subset wherein each icon represents a transition between two consecutive icons of the first subset. For example, an icon of said second subset comprising the superposition of the two elements represented by said two consecutive icons of the first subset. Icons are ordered by increasing or decreasing range of scales of size.

On FIG. 4, an icon of the first subset is illustrated, representing a DNA structure, for a range of scales of size corresponding to the dimensions of the current view less than 0.0002 m.

The animation transition between FIGS. 4 and 5 is between 0.0002 m and 0.00025 m.

On FIG. 5, an icon of the second subset is illustrated, representing a living cell and the DNA structure of FIG. 4, for a range of scales of size corresponding to the dimensions of the current view comprised between 0.00025 m and 0.0005 m.

On FIG. 6, an icon of the first subset is illustrated, representing the living cell of FIG. 5, for a range of scales of size corresponding to the dimensions of the current view comprised between 0.0005 m and 0.002 m.

The animation transition between FIGS. 6 and 7 is between 0.002 m and 0.0025 m.

On FIG. 7, an icon of the second subset is illustrated, representing a beetle and the living cell of FIG. 6, for a range of scales of size corresponding to the dimensions of the current view comprised between 0.0025 m and 0.005 m.

On FIG. 8 an icon of the first subset is illustrated, representing the beetle of FIG. 7, for a range of scales of size corresponding to the dimensions of the current view comprised between 0.005 m and 0.02 m.

The animation transition between FIGS. 8 and 9 is between 0.02 m and 0.025 m.

On FIG. 9, an icon of the second subset is illustrated, representing a human hand and the beetle of FIG. 8, for a range of scales of size corresponding to the dimensions of the current view comprised between 0.025 m and 0.05 m On FIG. 10 an icon of the first subset is illustrated, representing the human hand of FIG. 9, for a range of scales of size corresponding to the dimensions of the current view comprised between 0.05 m and 0.2 m.

The animation transition between FIGS. 10 and 11 is between 0.2 m and 0.5 m.

On FIG. 11, an icon of the second subset is illustrated, representing a man and the hand of FIG. 10, for a range of scales of size corresponding to the dimensions of the current view comprised between 0.25 m and 0.5 m.

On FIG. 12, an icon of the first subset is illustrated, representing the man of FIG. 11, for a range of scales of size corresponding to the dimensions of the current view comprised between 0.5 m and 2 m.

The animation transition between FIGS. 12 and 13 is between 2 m and 2.5 m.

On FIG. 13, an icon of the second subset is illustrated, representing the tree and the man of FIG. 12, for a range of scales of size corresponding to the dimensions of the current view comprised between 2.5 m and 5 m.

On FIG. 14, an icon of the first subset is illustrated, representing the tree of FIG. 13, for a range of scales of size corresponding to the dimensions of the current view comprised between 5 m and 20 m.

The animation transition between FIGS. 14 and 15 is between 20 m and 25 m.

On FIG. 15, an icon of the second subset is illustrated, representing a building and the tree of FIG. 14, for a range of scales of size corresponding to the dimensions of the current view comprised between 25 m and 50 m.

On FIG. 16, an icon of the first subset is illustrated, representing the building of FIG. 15, for a range of scales of size corresponding to the dimensions of the current view comprised between 50 m and 200 m.

The animation transition between FIGS. 6 and 7 is between 200 m and 250 m.

On FIG. 17, an icon of the second subset is illustrated, representing a mountain and the building of FIG. 16, for a range of scales of size corresponding to the dimensions of the current view comprised between 250 m and 500 m.

On FIG. 18, an icon of the first subset is illustrated, representing the mountain of FIG. 17, for a range of scales of size corresponding to the dimensions of the current view greater than 500 m.

The computer-implemented method of designing a modeled assembly of at least one object in a computer-aided design system, comprises the steps of:
  providing a set of icons, each icon being representative of a range of scales of size;
  determining the dimensions of a view of said modeled assembly; and
  displaying continuously the icon representative of the range of scales of size corresponding to said dimensions.

Figure 19:
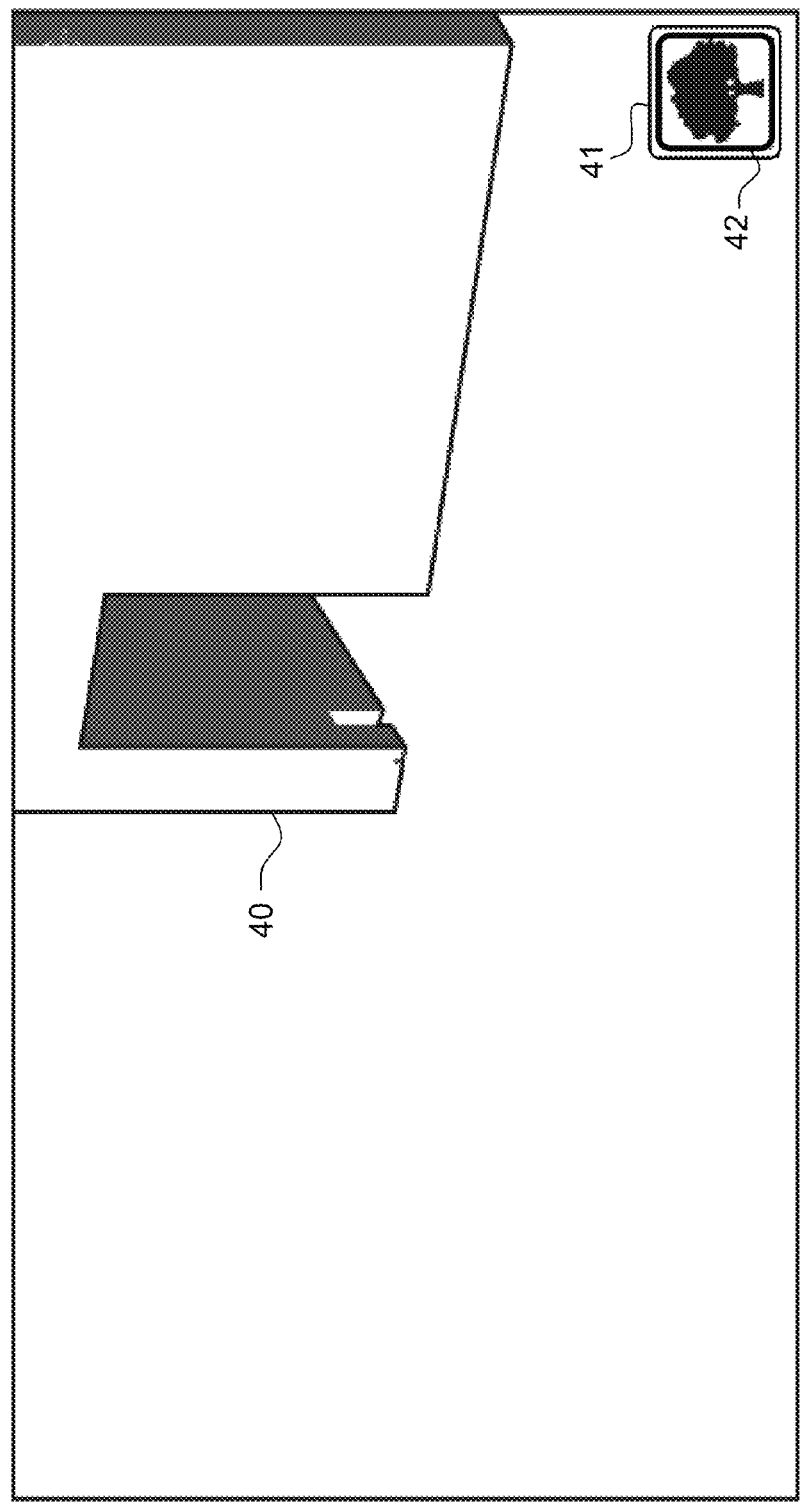
FIGS. 19 up to 26 illustrate an example of a zoom of the view of a modeled assembly of at least one object, according to an aspect of the invention.

On FIGS. 19 up to 26, as on FIGS. 27 up to 37, a transition between an icon of the first subset and an icon of the second subset during a zoom of the view of the assembly 40 of at least one object is illustrated. On this example, the used icons are the three icons corresponding to a transition between the range of scale of size corresponding to the tree of FIG. 14 and the man of FIG. 12, using the icon of FIG. 13.

For example, icons are displayed on the screen in an external fixed frame 41. In the examples of the present descriptions, an optional dynamic frame 42 is described, said dynamic frame 42 is dynamically displayed on the displayed icon, to indicate the size of said view relative to the range of scales of size represented by the displayed icon.

Figure 20:
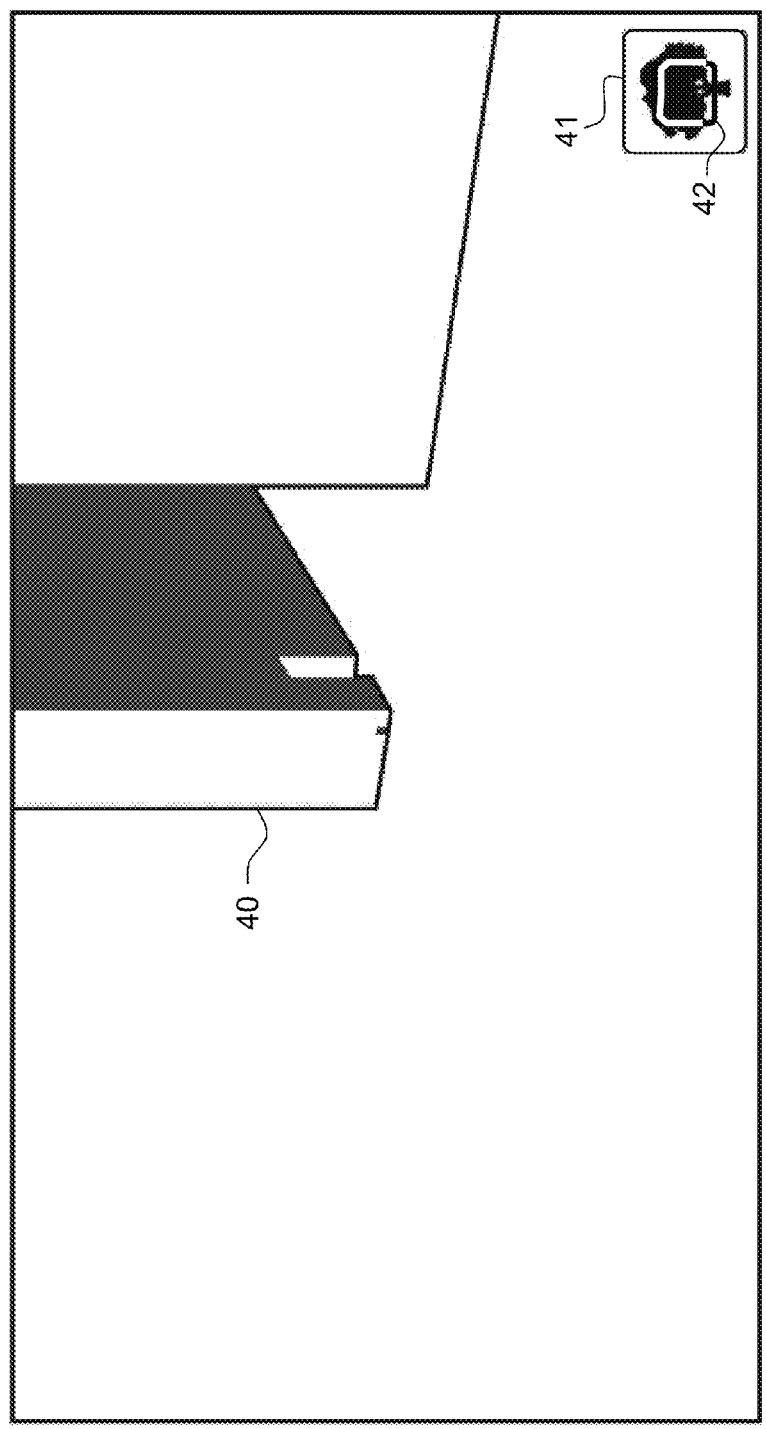
Figure 21:
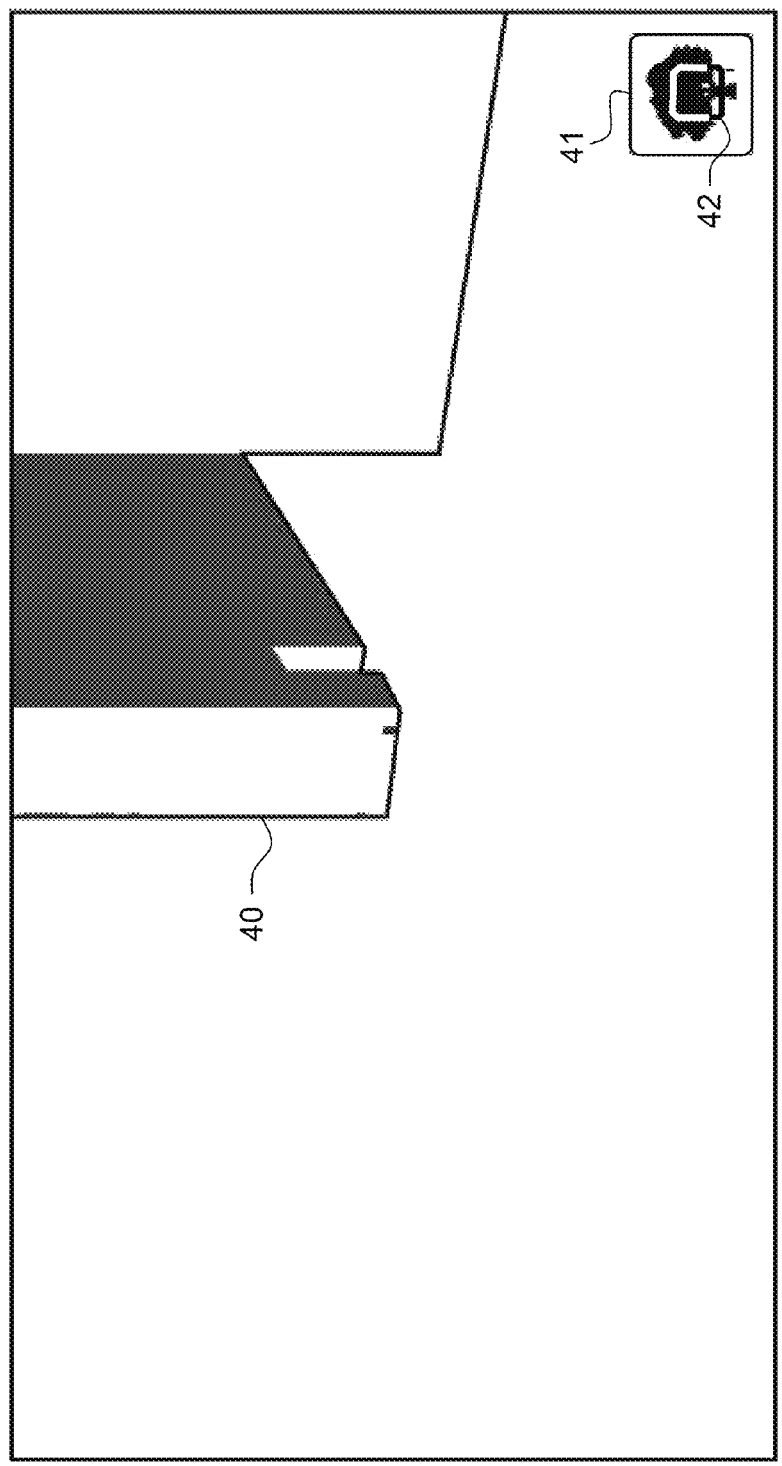
Figure 22:
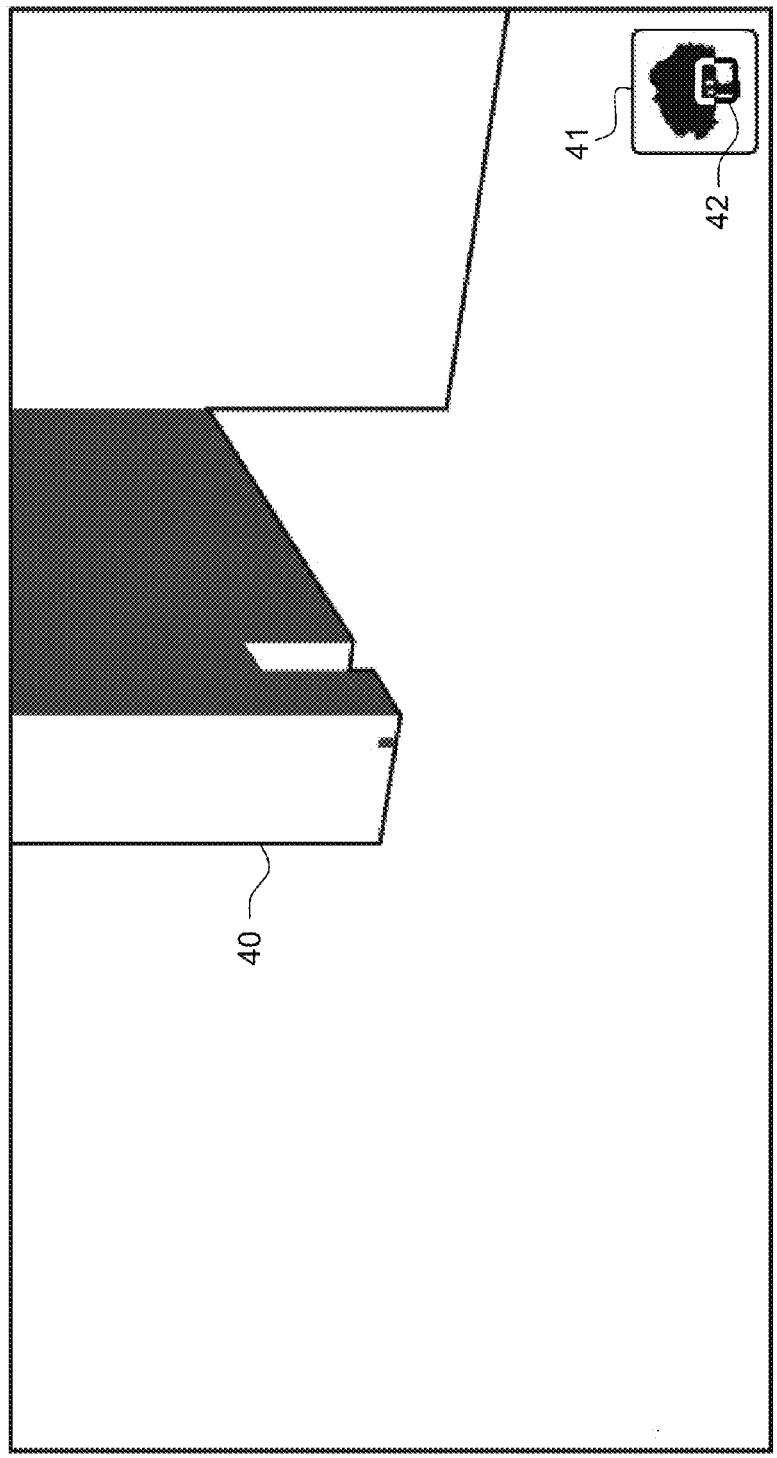
Figure 23:
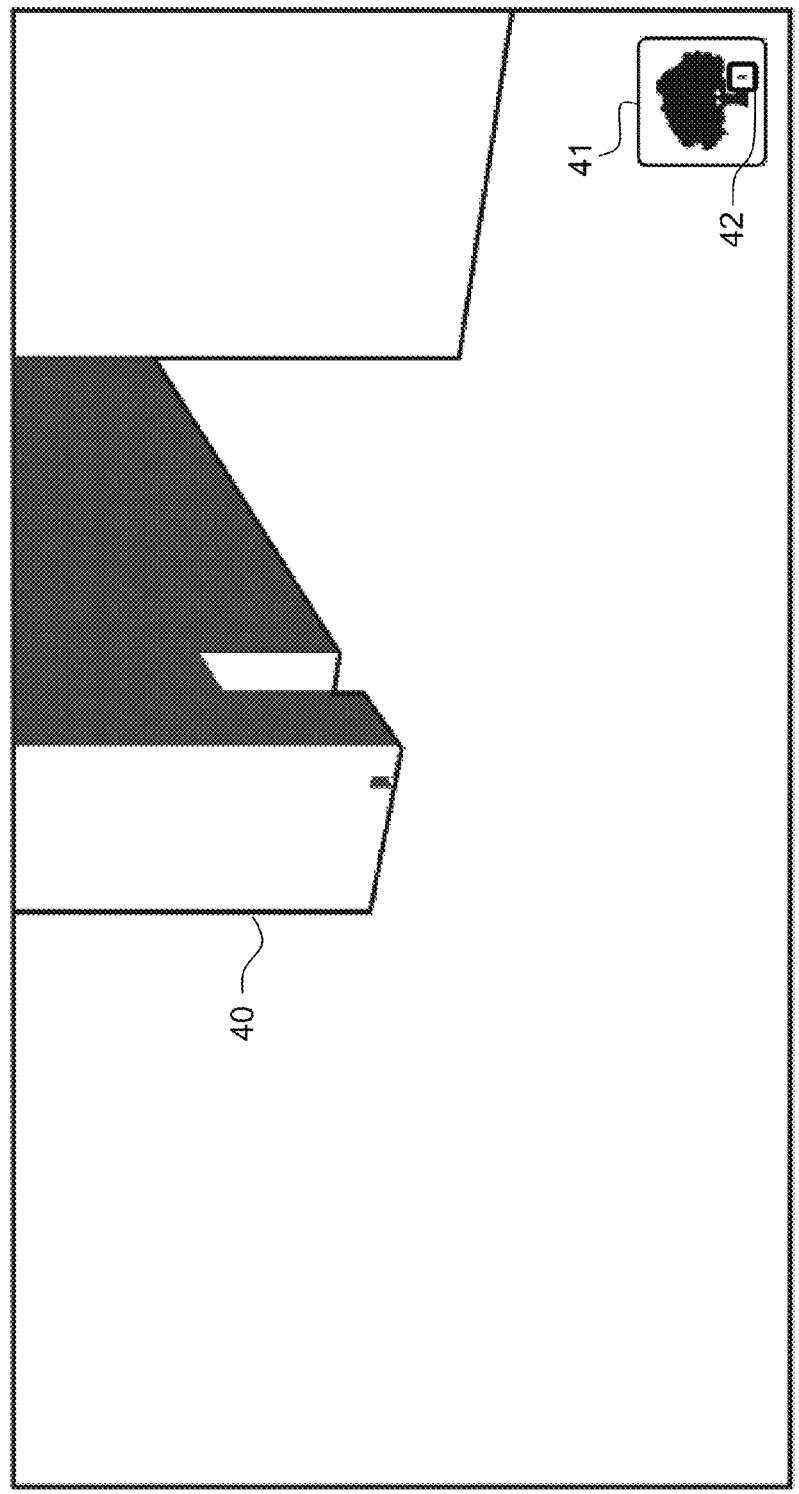
Figure 24:
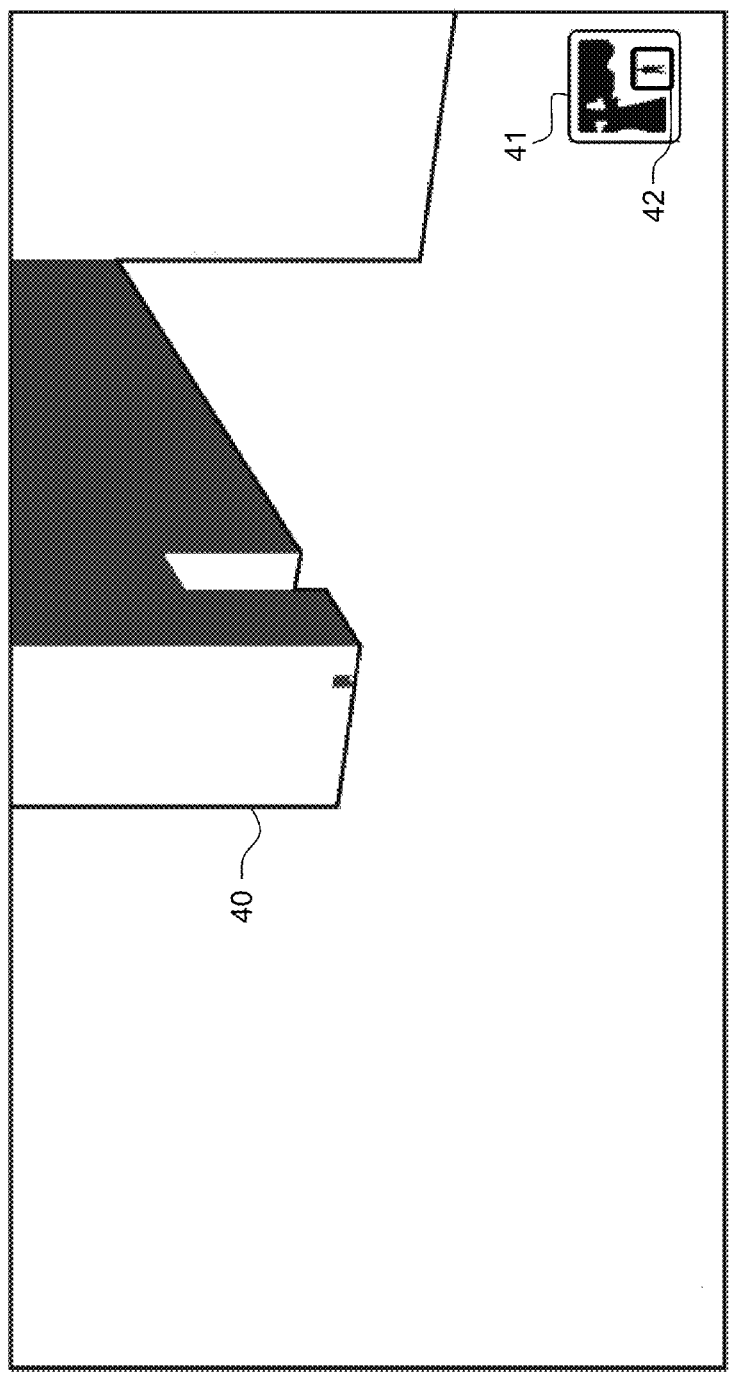
Figure 26:
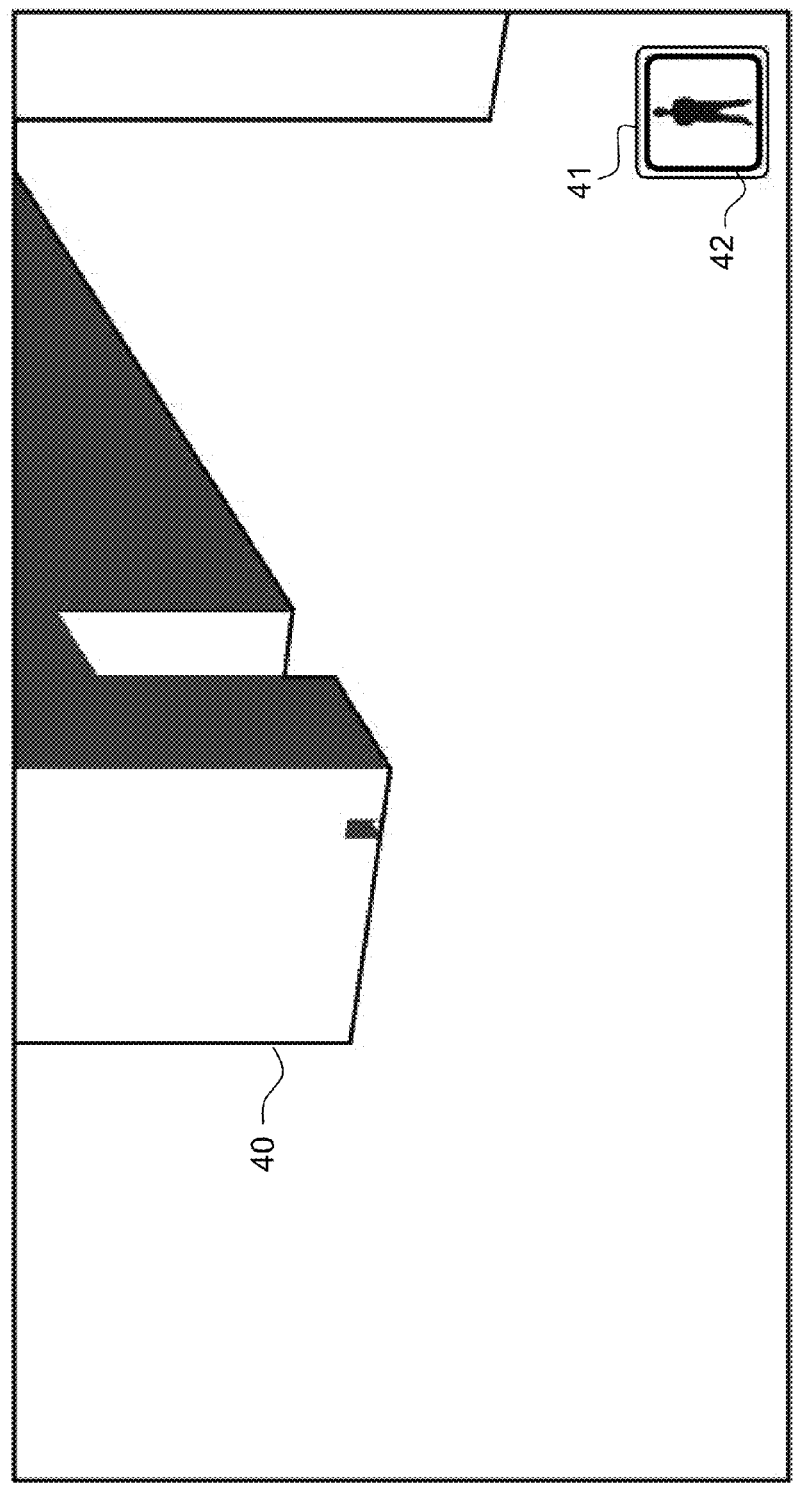
FIGS. 26 down to 19 illustrate an example of a un unzoom of the view of an assembly of at least one object, according to an aspect of the invention.

During such a zoom of the view of the assembly 40 of at least one object, the corresponding linked displaying of the series of said three icons alternatively in the first and second subsets and ordered by increasing or decreasing range of scales of size the following iterative steps are effected:
  the size of the dynamic frame 42 is decreased relatively to the icon of the first subset representing the tree of FIG. 14, like illustrated on FIGS. 19 and 20, or on FIGS. 27 up to 29;
  the following icon of said ordered series, in the decreasing order, in this case the icon of the second subset representing the tree and the man of FIG. 13, replaces continuously the preceding icon, the common element of the two icons, in this case the tree, is superposed at the moment of change of icon, as illustrated on FIG. 21 or on FIG. 30;
  the dynamic frame 42 focus on the other element, in this case the man, as illustrated on FIGS. 22 and 23, or on FIGS. 30 up to 33;
  the size of the dynamic frame 42 and the displayed part of the icon representing the tree and the man changes simultaneously in the inverse proportions, like illustrated on FIGS. 24 up to 26, wherein the following icon representing the man of FIG. 12 replaces continuously the corresponding part of the icon representing the tree and the man of FIG. 13; and the following icon of said ordered series, in this case the icon of the man of the FIG. 12, in the decreasing order, replaces continuously the preceding icon, in this case the icon representing the tree and the man of FIG. 13, like illustrated on FIG. 26, during an animation of the icon of the second subset.

On FIGS. 26 down to 19 a transition between an icon of the first subset and an icon of the second subset during a unzoom of the view of the assembly 40 of at least one object is illustrated. On this example, the icons used are the three icons corresponding to a transition between the range of scale of size corresponding to the man of FIG. 12 and the tree of FIG. 14, using the icon of FIG. 13 representing the tree and the man.

Figure 25:
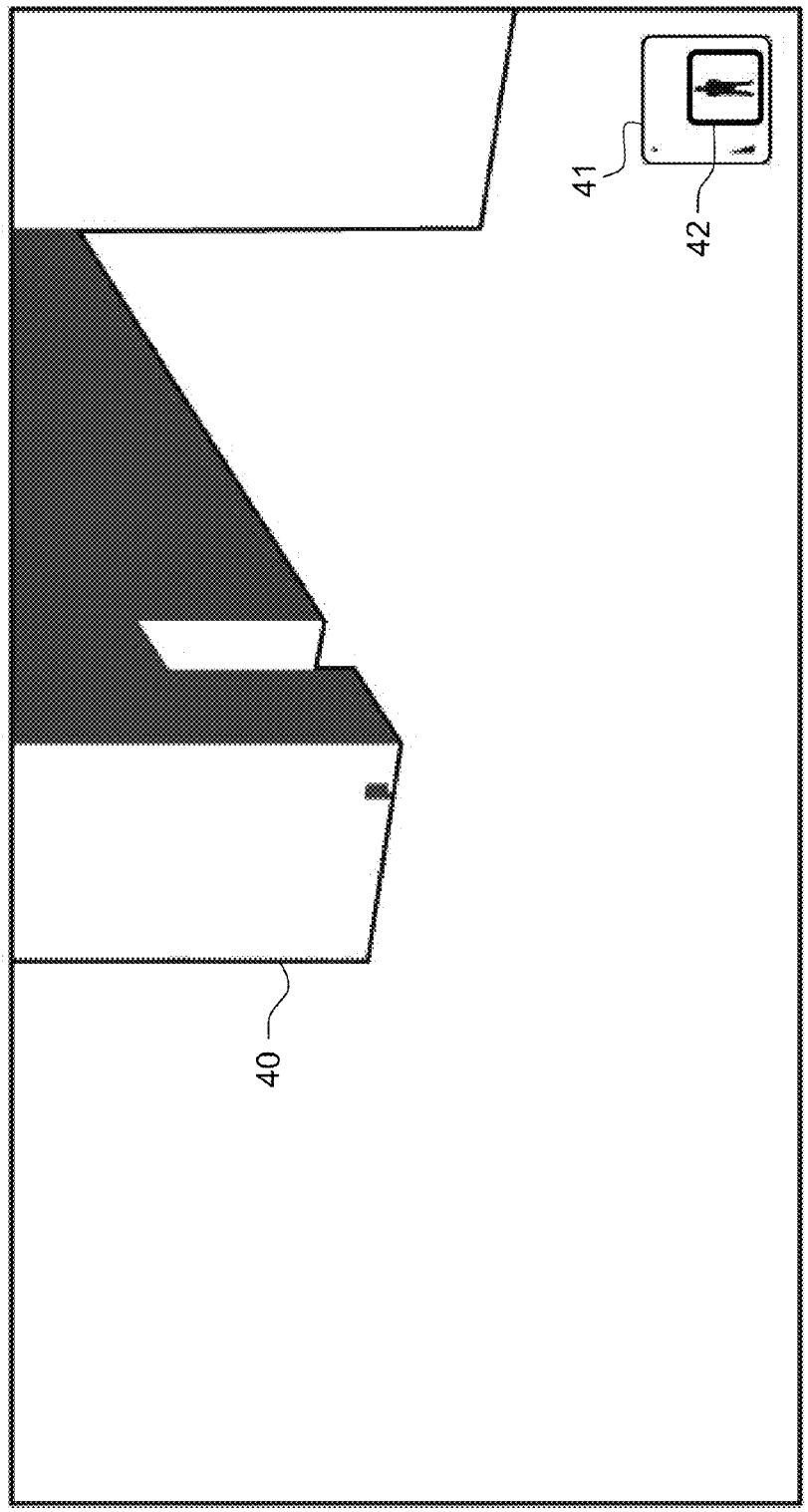

During such an unzoom of the view of the assembly 40 of at least one object, the corresponding linked displaying of the series of said three icons alternatively in the first and second subsets and ordered by increasing or decreasing range of scales of size the following iterative steps are effected:

the following icon of said ordered series, in the increasing order, in this case the icon of the second subset representing the tree and the man of FIG. 13, replaces continuously the preceding icon representing the man of FIG. 12, with the adapted proportions, the common element of the two icons, i.e. the man, is superposed at the moment of change of icon, like illustrated on FIG. 26 or on FIG. 37, during an animation of the icon of the second subset;

the size of the dynamic frame 42 and the displayed part of the icon representing the tree and the man of FIG. 13 changes simultaneously in the inverse proportions, like illustrated on FIGS. 25 down to 23, or on FIGS. 36 down to 33;

the dynamic frame 42 focus on the other element, in this case the tree, like illustrated on FIG. 22 down to 21; and the size of the dynamic frame 42 is decreased relatively to the icon representing the tree of FIG. 14, like illustrated on FIGS. 20 down to 19, or on FIGS. 29 down to 27.

Figure 38:
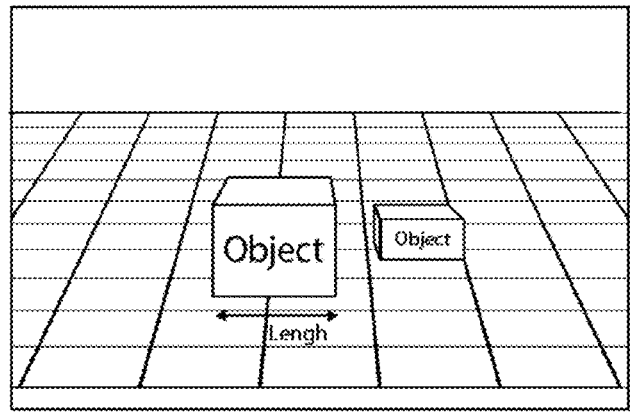
FIGS. 38, 39, and 40 illustrate an example of determining the dimensions of a view of a modeled assembly of at least one object and displaying continuously the icon representative of the range of scales of size corresponding to said dimensions, according to an aspect of the invention.
Figure 39:
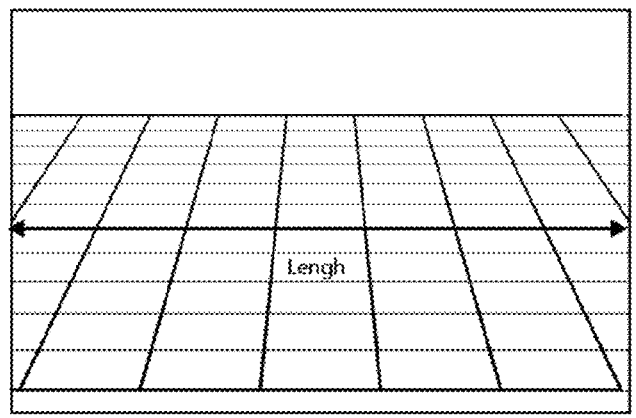
Figure 40:
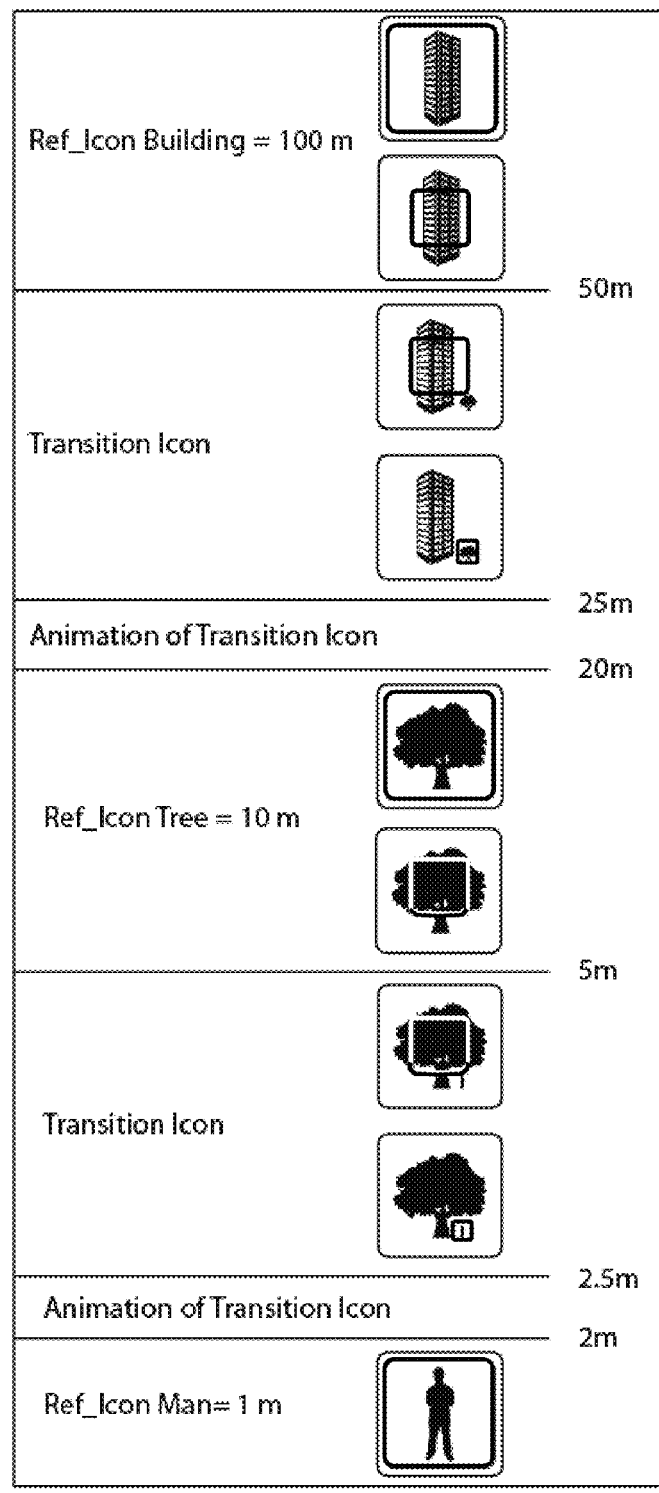

On FIGS. 38, 39, and 40, an example of determination of the dimensions of a view of the modeled assembly and of displaying continuously the icon representative of the range of scales of size corresponding to said dimensions, is illustrated.

On FIGS. 38, 39 and 40 is represented a screen for displaying the modeled assembly. The following example is not limitative.

The system calculates a size of reference Ref_Size_Comp at any time by calculating the ratio of displayed objects to the total size of the screen (if there is no assembly of at least one object displayed Ref_Size_Comp is computed by projecting a virtual line at the middle of the screen and calculating the length it would have on the ground of the 3D scene).

When there is a change in the degree of zoom, the system chooses the best fitting icon to display and for small variations uses a scaling of the dynamic frame. Icons of the second subset are used to make the bridge between two successive icons of the first subset.

Each Icon has its own domain of display Ref_Size_Icon or, in other words its own range of scales of size, which is centered on a value attached to the icon. Icons of the second subset, or in other words transition icons share the domain of display Ref_Size_Icon with icons of the first subset, or in other words with main icons, but they don't have the same range of display. For the present example:

Ref_Size_DNA=0.0001 m

Ref_Size_Cell=0.001 m

Ref_Size_Beetle=0.01 m

Ref_Size_Hand=0.1 m

Ref_Size_Man=1 m

Ref_Size_Tree=10 m

Ref_Size_Building=100 m

Ref_Size_Mountain=1000 m

The main icon is displayed when the following relation is verified:

Ref_Size_Icon×2≥Ref_Size_Comp≥Ref_Size_Icon×0.5.

The transition icon is displayed when the following relation is verified:

Ref_Size_Icon×0.5>Ref_Size_Comp≥Ref_Size_Icon×0.25.

It defines its range of appearance and usage by the software. In the case of the Icon of man, the domain of display Ref_Size_Icon is of 1 m. Then it will be displayed when:

1×2≥Ref_Size_Comp≥1×0.5, i.e. when:

2≥Ref_Size_Comp≥0.5

The icon of Man is displayed when the size of reference Ref_Size_Comp is comprised between 0.5 m and 2 m.

The transition icon between the icons of man and of hand, is displayed when 0.5>Ref_Size_Comp≥0.25. This transition icon is displayed when the size of reference Ref_Size_Comp is comprised between 0.25 m and 0.5 m.

For example if the size of reference Ref_Size_Comp is of 1.5 m, the system display the icon of man because the domain of display Ref_Size_Man is between 0.5 and 2 m. If the size of reference Ref_Size_Comp is of 0.4 m, then the system displays the icon representing the man and its hand (i.e. transition icon between the icons of man and of hand).

But if the size of reference Ref_size_Comp is not corresponding to a domain of validity of any icon, it should display an animation of a transition icon. For example if the size of reference Ref_Size_Comp is 2.1 m, which is bigger than the upper boundary of the icon of man (which is 2 m) and lower than the lower boundary of transition icon of tree and man (which is 2.5 m), an animation of the transition icon of tree and man is displayed in the external frame 41, to display the good size clue.

The animation of icons, when there is a transition from an icon to another icon, for example when switching from the icon of man of FIG. 12 to the icon of tree and man of FIG. 13, during an unzooming or dezooming, is made with the use of an animation of the icon of the second subset.

The size of reference Ref_Size_Comp is of 2 m. It represents the validity boundary of the icon of man, which is displayed. When the size of reference Ref_Size_Comp grows to 2.1 m, a transition between the icon of man of FIG. 12 and the icon of tree and man. A part of the icon of tree and man of FIG. 13 wherein only the man is displayed with the corresponding dynamic frame.

When the user continue to unzoom, the size of reference Ref_Size_Comp grows for instance to 2.3 m, and the displayed part of the icon of tree and man grows until the icon is completely displayed, when the size of reference Ref_Size_Comp is equal to 2.5 m. The dynamic frame 40 following in a uniform manner this transition, staying at a size corresponding to the size of the icon of man Ref_Size_Man.

Said chosen values for transitions are only examples chosen such as the difference between 2×Ref_Size_precedingIcon and 0.25×Ref_Size_followingIcon is minimal, with a simple calculating. Alternatively, this difference can be smaller.

The animation of icons, when there is a transition from an icon to another icon, for example when switching from the icon of tree and man of FIG. 13 to the icon of man of FIG. 12, during a zooming, is made with the use of an animation of the icon of the second subset.

When Ref_Size_Comp=2.5, the displayed icon is the icon of tree and man of FIG. 13. When the user zoom, the size of reference Ref_Size_Comp decreases and the transition begins.

The current icon is gradually enlarged as such a part of the icon is displayed without overflowing the external frame 41, whereas the size of reference Ref_Size_Comp decreases. The dynamic frame 40, centered on the man of the icon of tree and man grows at the same speed. When the size of reference Ref_Size_Comp reaches 2 m, the zoomed part of the icon tree and man of FIG. 13 represents the icon of man of FIG. 12. The dynamic frame 40 is also well positioned.

There is a transition between icons when there is an extrapolation from the current icon to the next icon to be displayed, depending if the user is zooming or dezooming. The transition consists in transforming the current icon into the next icon by zooming or dezooming directly on of said icons. That's why each icon of the first subset, representing a usual element, is comprised into the next icon of the second subset, representing a transition between two consecutive icons of the first subset. The transition is enhanced by the red frame which directly fits to the part of the icon which will become the next one.

The dynamic frame is always fitted to the next ordered icon. Its size varies to give a more precise clue about the size of the displayed assembly of at least one object in the scene.

While this invention has been particularly shown and described with references to example embodiments thereof, it will be understood by those skilled in the art that various changes in form and details may be made therein without departing from the scope of the invention encompassed by the appended claims.

The invention claimed is:

1. A computer-implemented method of designing a modeled assembly of at least one object in a computer-aided design system, the method comprising the steps of:
    providing a set of icons, each icon being representative of a range of scales of size, comprising a first pre-defined subset wherein each icon represents a different usual element, and a second subset wherein each icon represents a transition between two consecutive icons of the first subset;
    determining the dimensions of a view of said modeled assembly;
    displaying, in an external frame, an icon of the first set when the determined dimensions of the view correspond to the associated scale of size, otherwise displaying in the external frame, a transition icon of the second set representing the continuous transition between two consecutive icons of the first subset, wherein a dynamic frame is dynamically displayed on the displayed transition icon to indicate the determined dimensions of said view relative to the range of scales of size represented by the displayed transition icon;
    receiving a request to zoom or unzoom the displayed view; and
    in response to the request, providing a corresponding linked displaying of a series of icons alternatively in the first and second subsets, where the first and second subsets are ordered by an increasing or decreasing range of scales of size.

2. Method according to claim 1, wherein an icon of said second subset comprises the superposition of the two elements represented by said two consecutive icons of the first subset.

3. Method according to claim 1, wherein, the request to zoom or unzoom is made in the external frame, so as to obtain in the external frame a passage without discontinuity between two successive displayed icons, each from a different subset.

4. Method according to claim 1, wherein, during a zoom of said view, the corresponding linked displaying of a series of icons alternatively in the first and second subsets and ordered by increasing or decreasing range of scales of size, comprises the iterative steps of:
    the size of the dynamic frame is decreased relatively to an icon of the first subset of said series;
    the following icon of said ordered series, in the decreasing order, replaces continuously the preceding icon, the common element of the two icons is superposed at the moment of change of icon;
    the dynamic frame focuses on the other element;
    the size of the dynamic frame and the displayed part of the icon change simultaneously in the inverse proportions; and
    the following icon of said ordered series, in the decreasing order, replaces continuously the preceding icon during an animation of the icon of the second subset.

5. Method according to claim 1, wherein, during an unzoom of said view, the corresponding linked displaying of a series of icons alternatively in the first and second subsets and ordered by increasing or decreasing range of scales of size, comprises the iterative steps of:
    the following icon of said ordered series, in the increasing order, replaces continuously the preceding icon, with the adapted proportions, the common element of the two icons is superposed at the moment of change of icon, during an animation of the icon of the second subset;
    the size of the dynamic frame and the displayed part of the icon change simultaneously in the inverse proportions;
    the dynamic frame focuses on the other element; and
    the size of the dynamic frame is decreased relatively to the icon.

6. A non-transitory tangible computer readable medium embodying a computer program product for designing an assembly of objects in a system of computer-aided design, the computer program comprising code means for causing the system of computer-aided design to take the steps:
    providing a set of icons, each icon being representative of a range of scales of size, comprising a first pre-defined subset wherein each icon represents a different usual element, and a second subset wherein each icon represents a transition between two consecutive icons of the first subset;
    determining the dimensions of a view of said modeled assembly;
    displaying, in an external frame, an icon of the first set when the determined dimensions of the view correspond to the associated scale of size, otherwise displaying in the external frame, a transition icon of the second set representing the continuous transition between two consecutive icons of the first subset, wherein a dynamic frame is dynamically displayed on the displayed transition icon to indicate the determined dimensions of said view relative to the range of scales of size represented by the displayed transition icon;

receiving a request to zoom or unzoom the displayed view; and in response to the request, providing a corresponding linked displaying of a series of icons alternatively in the first and second subsets, where the first and second subsets are ordered by an increasing or decreasing range of scales of size.

7. An apparatus for designing an assembly of objects in a system of computer-aided design, the apparatus comprising a processor configured to:

provide a set of icons, each icon being representative of a range of scales of size, comprising a first pre-defined subset wherein each icon represents a different usual element, and a second subset wherein each icon represents a transition between two consecutive icons of the first subset;

determine the dimensions of a view of said modeled assembly;

display, in an external frame, an icon of the first set when the determined dimensions of the view correspond to the associated scale of size, otherwise display in the external frame, a transition icon of the second set representing the continuous transition between two consecutive icons of the first subset, wherein a dynamic frame is dynamically displayed on the displayed transition icon to indicate the determined dimensions of said view relative to the range of scales of size represented by the displayed transition icon;

receive a request to zoom or unzoom the displayed view; and in response to the request, provide a corresponding linked displaying of a series of icons alternatively in the first and second subsets, where the first and second subsets are ordered by an increasing or decreasing range of scales of size.

8. An apparatus as claimed in claim 7 wherein an icon of said second subset comprises the superposition of the two elements represented by said two consecutive icons of the first subset.

9. An apparatus as claimed in claim 7 wherein, the request to zoom or unzoom is made in the external frame, so as to obtain in the external frame a passage without discontinuity between two successive displayed icons, each from a different subset.

10. An apparatus as claimed in claim 7 wherein during a zoom of said view, the corresponding linked displaying of a series of icons alternatively in the first and second subsets and ordered by increasing or decreasing range of scales of size, comprises the iterative steps of:

the size of the dynamic frame is decreased relatively to an icon of the first subset of said series;

the following icon of said ordered series, in the decreasing order, replaces continuously the preceding icon, the common element of the two icons is superposed at the moment of change of icon;

the dynamic frame focuses on the other element;

the size of the dynamic frame and the displayed part of the icon change simultaneously in the inverse proportions; and the following icon of said ordered series, in the decreasing order, replaces continuously the preceding icon during an animation of the icon of the second subset.

* * * * *